United States Patent
Machida

(10) Patent No.: US 11,105,562 B2
(45) Date of Patent: Aug. 31, 2021

(54) LOOP-TYPE HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 130 days.

(21) Appl. No.: 16/711,006

(22) Filed: Dec. 11, 2019

(65) Prior Publication Data

US 2020/0200485 A1 Jun. 25, 2020

(30) Foreign Application Priority Data

Dec. 19, 2018 (JP) .............................. JP2018-237703

(51) Int. Cl.
*F28D 15/00* (2006.01)
*F28D 15/04* (2006.01)

(52) U.S. Cl.
CPC .......... *F28D 15/043* (2013.01); *F28D 15/046* (2013.01)

(58) Field of Classification Search
CPC ............. F28D 15/0233; F28D 15/0266; F28D 15/043; F28D 15/046
See application file for complete search history.

(56) References Cited

U.S. PATENT DOCUMENTS

| | | | | |
|---|---|---|---|---|
| 7,051,793 B1 * | 5/2006 | Schulz-Harder | .... | F28D 15/0233 165/104.26 |
| 7,188,662 B2 * | 3/2007 | Brewer | ................. | H01L 23/473 165/80.4 |
| 2002/0029873 A1 * | 3/2002 | Sugito | ..................... | F28F 13/06 165/166 |
| 2002/0135979 A1 * | 9/2002 | Estes | ...................... | H01L 23/427 361/688 |
| 2003/0079863 A1 * | 5/2003 | Sugito | ................... | F28F 13/187 165/104.21 |
| 2003/0159809 A1 * | 8/2003 | Valenzuela | ......... | F28D 15/0233 165/104.26 |
| 2005/0022978 A1 * | 2/2005 | Duval | ................. | F28D 15/0233 165/104.26 |
| 2007/0084587 A1 * | 4/2007 | Huang | ................... | B22F 7/002 165/104.26 |
| 2009/0236085 A1 * | 9/2009 | Wang | .................... | F28D 15/046 165/169 |

(Continued)

FOREIGN PATENT DOCUMENTS

| | | |
|---|---|---|
| JP | 6146484 | 5/2017 |
| WO | 2015/087451 | 6/2015 |

*Primary Examiner* — Travis C Ruby
(74) *Attorney, Agent, or Firm* — Rankin, Hill & Clark LLP

(57) ABSTRACT

A liquid pipe has a flow path provided in a stacked body of a plurality of metal layers. The plurality of metal layers includes a first metal layer configuring an upper wall surface of the flow path, a second metal layer configuring a lower wall surface of the flow path, and an intermediate metal layer stacked between the first metal layer and the second metal layer and configuring right and left wall surfaces of the flow path. The porous body includes a first porous body having first and second bottomed holes and fine pores provided in the first metal layer, and a second porous body having first and second bottomed holes and fine pores provided in the second metal layer. The porous body is not provided in the intermediate metal layer.

10 Claims, 14 Drawing Sheets

(56) References Cited

U.S. PATENT DOCUMENTS

| | | | |
|---|---|---|---|
| 2011/0005724 A1* | 1/2011 | Kasai | F28D 15/0233 |
| | | | 165/104.21 |
| 2012/0145358 A1* | 6/2012 | Moon | F28D 15/046 |
| | | | 165/104.26 |
| 2012/0208265 A1* | 8/2012 | Partsch | F28F 3/086 |
| | | | 435/289.1 |
| 2013/0126139 A1* | 5/2013 | Tsuruta | F28F 3/12 |
| | | | 165/170 |
| 2014/0138057 A1* | 5/2014 | Horng | F28D 15/046 |
| | | | 165/104.26 |
| 2014/0345841 A1* | 11/2014 | Chen | H01L 23/427 |
| | | | 165/185 |
| 2016/0259383 A1* | 9/2016 | Shioga | F28D 15/046 |
| 2016/0290733 A1* | 10/2016 | Noishiki | F28F 9/0204 |
| 2017/0299239 A1* | 10/2017 | Steven | F25B 39/00 |

\* cited by examiner

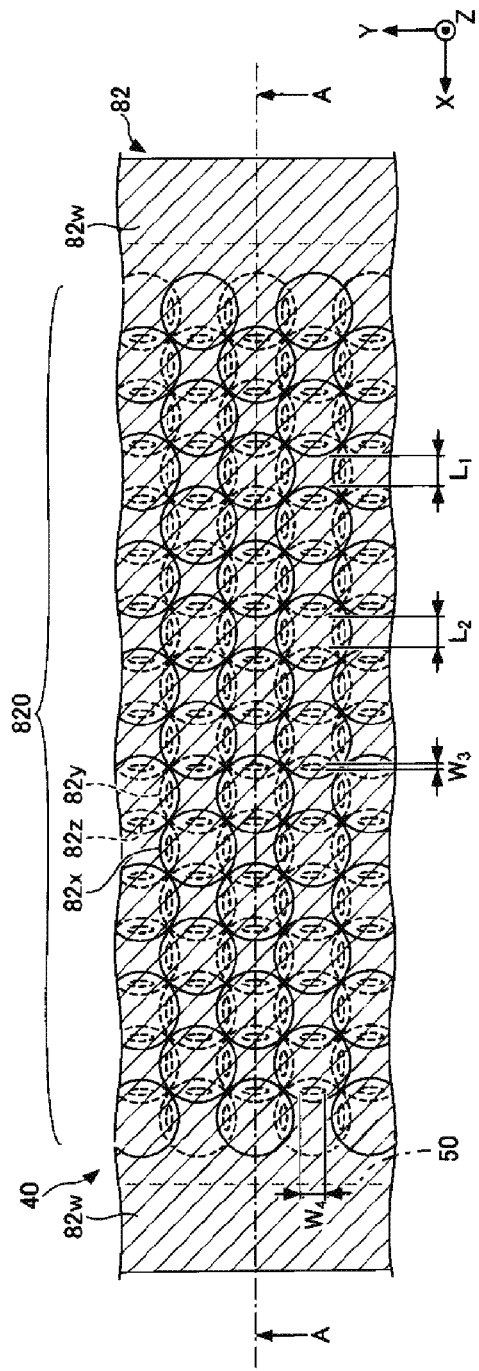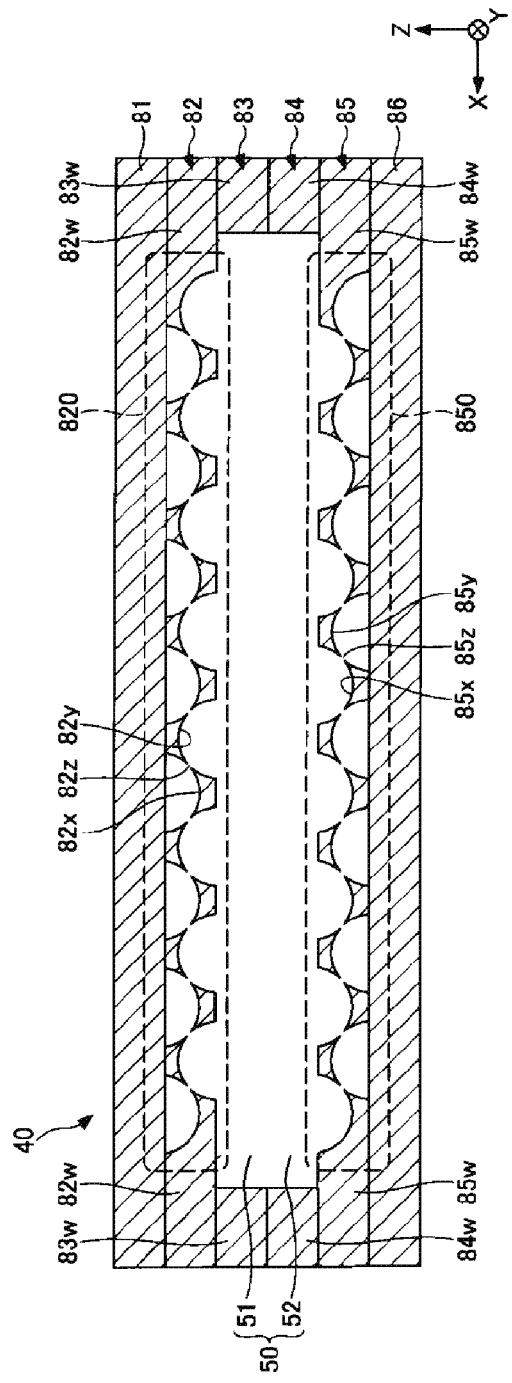

LOOP-TYPE HEAT PIPE

CROSS-REFERENCE TO RELATED APPLICATIONS

This application is based upon and claims the benefit of priority from prior Japanese patent application No. 2018-237703, filed on Dec. 19, 2018, the entire contents of which are incorporated herein by reference.

TECHNICAL FIELD

The present disclosure relates to a loop-type heat pipe.

BACKGROUND ART

As a device configured to cool heat generation components such as a CPU (Central Processing Unit) mounted on an electronic device, a heat pipe is known. The heat pipe is a device configured to transport heat by using a phase change of an operating fluid.

As the heat pipe, a loop-type heat pipe may be exemplified which includes an evaporator configured to vaporize the operating fluid by heat of the heat generation component and a condenser configured to cool and condense the vaporized operating fluid and the evaporator and the condenser are interconnected by a liquid pipe and a vapor pipe forming a loop-shaped flow path. In the loop-type heat pipe, the operating fluid flows in one direction along the loop-shaped flow path.

In the loop-type heat pipe, a pillar-shaped porous body is provided in the vicinity of a central part in the liquid pipe, for example, so that the operating fluid in the liquid pipe is guided to the evaporator by capillary force generated in the porous body and the vapor is suppressed from flowing back to the liquid pipe from the evaporator. The porous body is formed by stacking metal layers having through-holes formed therein so that the through-holes are to partially overlap (for example, refer to PTL 1).

[PTL 1] WO2015/087451

However, when the pillar-shaped porous body is provided in the vicinity of the central part in the liquid pipe, a flow path in the liquid pipe is divided in two by the porous body, so that a space sectional area of the flow path is narrowed, a pressure loss increases when the operating fluid flows and the flowing of the operating fluid is thus obstructed.

SUMMARY OF INVENTION

Aspect of non-limiting embodiments of the present disclosure is to provide a loop-type heat pipe capable of reducing a pressure loss when an operating fluid flows.

A loop-type heat pipe according to the non-limiting embodiment of the present disclosure comprises:
  an evaporator configured to vaporize an operating fluid;
  a condenser configured to condense the operating fluid;
  a liquid pipe configured to interconnect the evaporator and the condenser;
  a porous body provided in the liquid pipe; and
  a vapor pipe configured to interconnect the evaporator and the condenser and to form a loop together with the liquid pipe,
  wherein the liquid pipe has a flow path provided in a stacked body of a plurality of metal layers,
  wherein when a stacking direction of the metal layers is referred to as an upper and lower direction, the plurality of metal layers comprises:
    a first metal layer configuring an upper wall surface of the flow path,
    a second metal layer configuring a lower wall surface of the flow path, and
    an intermediate metal layer stacked between the first metal layer and the second metal layer and configuring right and left wall surfaces of the flow path,
  wherein the porous body comprises:
    a first porous body having first bottomed holes recessed from one surface of the first metal layer facing the flow path, second bottomed holes recessed from the other surface of the first metal, and fine pores formed as the first bottomed holes and the second bottomed holes partially communicate with each other, and
    a second porous body having first bottomed holes recessed from one surface of the second metal layer facing the flow path, second bottomed holes recessed from the other surface of the second metal layer, and fine pores formed as the first bottomed holes and the second bottomed holes partially communicate with each other, and
  wherein the porous body is not provided in the intermediate metal layer.

According to the present disclosure, it is possible to provide the loop-type heat pipe capable of reducing the pressure loss when the operating fluid flows.

BRIEF DESCRIPTION OF DRAWINGS

FIGS. 3A and 3B are views illustrating a flow path and a porous body provided in a liquid pipe in accordance with the exemplary embodiment (1 thereof).

DESCRIPTION OF EMBODIMENTS

Figure 1:
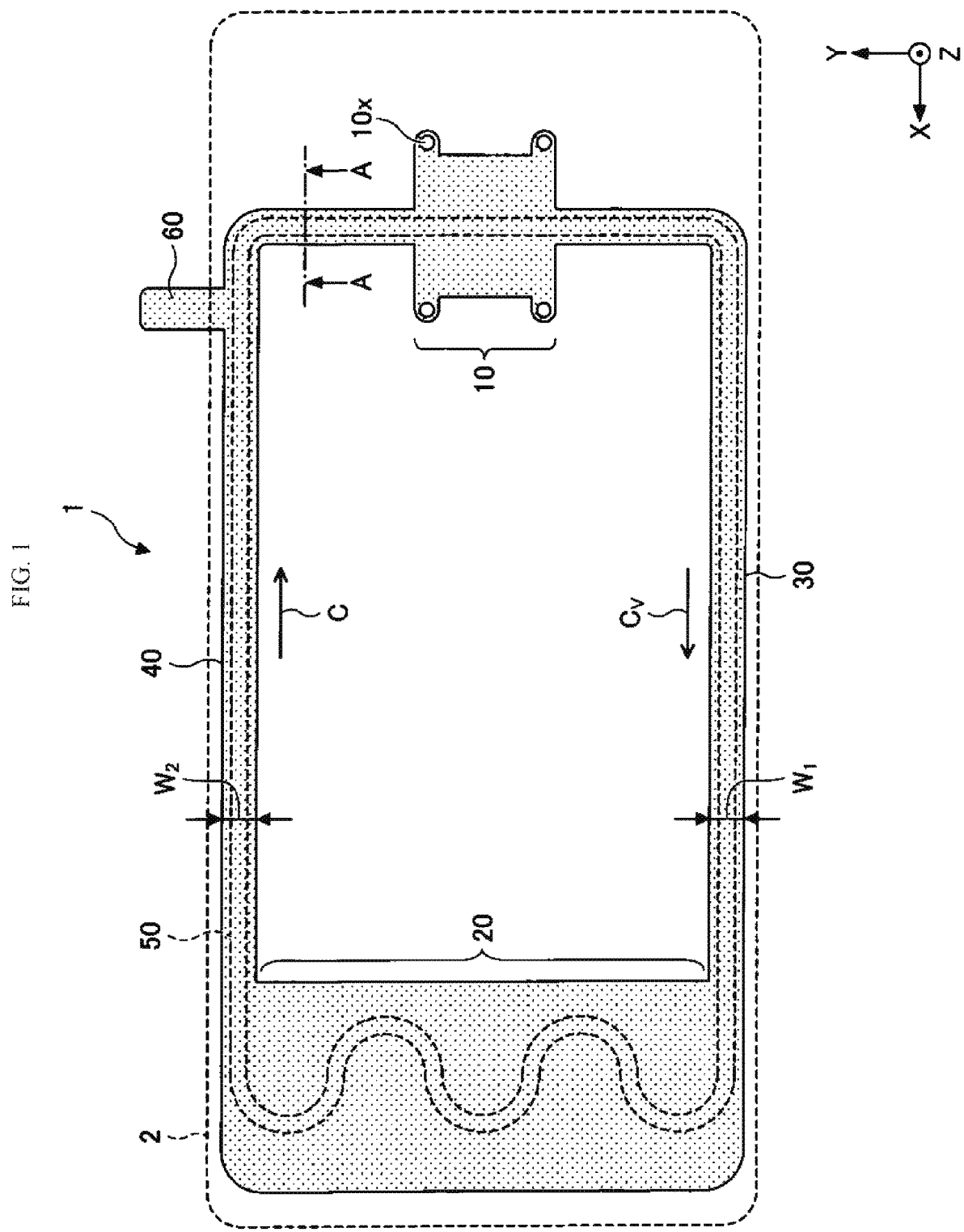
FIG. 1 is a pictorial plan view illustrating a loop-type heat pipe in accordance with an exemplary embodiment.

Hereinbelow, embodiments of the present disclosure will be described with reference to the drawings. In the meantime, in the respective drawings, the same configuration parts are denoted with the same reference numerals, and overlapping descriptions may be omitted.

Exemplary Embodiment

Structure of Loop-Type Heat Pipe of Exemplary Embodiment

First, a structure of a loop-type heat pipe in accordance with an exemplary embodiment is described. FIG. 1 is a pictorial plan view illustrating the loop-type heat pipe in accordance with the exemplary embodiment.

Referring to FIG. 1, a loop-type heat pipe 1 includes an evaporator 10, a condenser 20, a vapor pipe 30, a liquid pipe 40, and an inlet 60. The loop-type heat pipe 1 may be accommodated in a mobile-type electronic device 2 such as a smart phone and a tablet terminal, for example.

In the loop-type heat pipe 1, the evaporator 10 has a function of vaporizing an operating fluid C to thereby generate vapor Cv. The condenser 20 has a function of condensing the vapor Cv of the operating fluid C. The evaporator 10 and the condenser 20 are connected by the vapor pipe 30 and the liquid pipe 40, and a flow path 50, which is a loop in which the operating fluid C or the vapor Cv is to flow, is formed by the vapor pipe 30 and the liquid pipe 40.

The inlet 60 is an entry for injecting the operating fluid C into the liquid pipe 40, and is airtightly sealed after injecting the operating fluid C. In the exemplary embodiment, the inlet 60 is connected to the liquid pipe 40. However, the inlet 60 may be connected to the condenser 20 or the vapor pipe 30. In this case, the operating fluid C injected into the condenser 20 or the vapor pipe 30 flows in the flow path 50 and moves into the liquid pipe 40.

Figure 2:
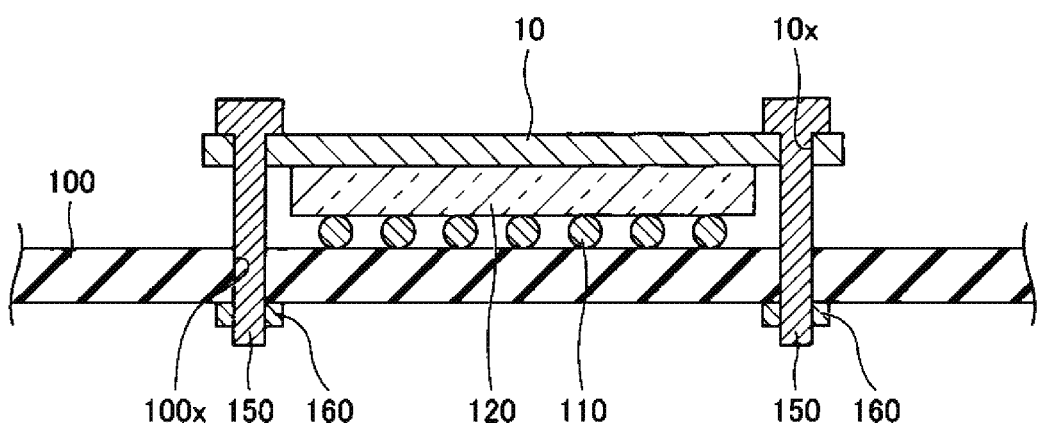
FIG. 2 is a sectional view showing an evaporator and a surrounding thereof of the loop-type heat pipe in accordance with the exemplary embodiment.

FIG. 2 is a sectional view showing the evaporator and a surrounding thereof of the loop-type heat pipe in accordance with the exemplary embodiment. As shown in FIGS. 1 and 2, the evaporator 10 is formed with four through-holes 10x, for example. Bolts 150 are inserted into the respective through-holes 10x formed in the evaporator 10 and respective through-holes 100x formed in a circuit board 100, and nuts 160 are fastened thereto from a lower surface of the circuit board 100, so that the evaporator 10 and the circuit board 100 are fixed.

On the circuit board 100, a heat generation component 120 such as a CPU is mounted via bumps 110, and an upper surface of the heat generation component 120 is closely contacted to a lower surface of the evaporator 10. The operating fluid C in the evaporator 10 is vaporized by heat generated from the heat generation component 120, so that the vapor Cv is generated.

As shown in FIG. 1, the vapor Cv generated by the evaporator 10 is guided to the condenser 20 through the vapor pipe 30, and is condensed in the condenser 20. Thereby, the heat generated from the heat generation component 120 moves to the condenser 20, so that an increase in temperature of the heat generation component 120 is suppressed. The operating fluid C condensed in the condenser 20 is guided to the evaporator 10 through the liquid pipe 40. A width $W_1$ of the vapor pipe 30 may be set to about 8 mm, for example. Also, a width $W_2$ of the liquid pipe 40 may be set to about 6 mm, for example. The width $W_1$ of the vapor pipe 30 and the width $W_2$ of the liquid pipe 40 are not limited thereto, and may be the same, for example.

The kind of the operating fluid C is not particularly limited. However, a fluid having a high vapor pressure and a high evaporative latent heat is preferably used so as to effectively cool the heat generation component 120 by the evaporative latent heat. As the fluid, for example, ammonia, water, Freon, alcohol and acetone may be exemplified.

The evaporator 10, the condenser 20, the vapor pipe 30, the liquid pipe 40, and the inlet 60 may have a structure where a plurality of metal layers is stacked, for example, respectively. The metal layers are copper layers having high heat conductivity, for example, and are directly bonded to each other by solid-phase bonding. A thickness of each metal layer may be set to about 50 μm to 200 μm, for example.

In the meantime, the metal layer is not limited to the copper layer and may be formed of stainless steel, aluminum, magnesium alloy and the like. Also, the number of metal layers to be stacked is not particularly limited.

FIGS. 3A and 3B are views illustrating a flow path and a porous body provided in the liquid pipe in accordance with the exemplary embodiment (1 thereof), in which FIG. 3A is a partial plan view in the vicinity of a line A-A of FIG. 1 and FIG. 3B is a sectional view taken along a line A-A of FIG. 3A (FIG. 1). In the meantime, in FIG. 3A, a metal layer 81, which is an outermost metal layer, is not shown.

As shown in FIG. 3B, the liquid pipe 40 has a structure where six layers of metal layers 81 to 86 are stacked. In the liquid pipe 40, the metal layers 81 and 86 are outermost layers, and the metal layers 82 to 85 are inner layers. The number of metal layers to be stacked in the liquid pipe 40 is not limited to six, and at least five or more metal layers have only to be stacked. That is, three or more inner layers have only to be stacked between the two outermost layers.

The metal layers 81 and 86 are located on both outer sides in a thickness direction of the stacked structure of the metal layers configuring the liquid pipe 40, and the metal layers 82 to 85 are stacked between the metal layer 81 and the metal layer 86.

The metal layers 81 to 86 are copper layers having high heat conductivity, for example, and are directly bonded to each other by solid-phase bonding. A thickness of each of the metal layers 81 to 86 may be set to about 50 μm to 200 μm, for example. In the meantime, the metal layers 81 to 86 are not limited to the copper layers and may be formed of stainless steel, aluminum, magnesium alloy and the like.

The liquid pipe 40 has the flow path 50 provided in the stacked body of the metal layers 81 to 86. The liquid pipe 40 preferably has only one flow path 50. That is, the flow path 50 is preferably a single flow path provided in the liquid pipe 40. Thereby, the operating fluid C can be enabled to easily flow. In the meantime, comparing one flow path of which a space sectional area is A and two flow paths of which a space sectional area is A/2, it is possible to reduce a pressure loss upon flowing of the operating fluid C in one flow path of which a space sectional area is A, so that the operating fluid C can easily flow.

Hereinbelow, a stacking direction (Z direction) of the metal layers is referred to as 'upper and lower direction (the metal layer 81 is located on an upper side)'. Also, a width direction (X direction) of the metal layer may be referred to as 'right and left direction'. The metal layers 81 and 86 are solid layers in which a hole and a groove are not formed, and configure parts of an outer wall of the liquid pipe 40. The metal layer 82 configures an upper wall surface of the flow path 50, and the metal layer 85 configures a lower wall surface the flow path 50. Also, the metal layers 83 and 84 stacked between the metal layer 82 and the metal layer 85 configured right and left wall surfaces of the flow path 50. In the meantime, the metal layers stacked between the metal layers configuring the upper and lower wall surfaces of the flow path 50 may be referred to as 'intermediate metal layers'. In the exemplary embodiment, the metal layers 83 and 84 are the intermediate metal layers. In the meantime, as the intermediate metal layer, at least one layer has only to be provided.

The liquid pipe 40 has a first porous body 820 provided in the metal layer 82 so as to face the flow path 50 and a second porous body 850 provided in the metal layer 85 so as to face the flow path 50. The intermediate metal layers are not provided with a porous body. That is, the metal layers 83 and 84 are not provided with a porous body.

The Z direction of the flow path 50 of the liquid pipe 40 is demarcated by a lower surface of the metal layer 82 having the porous body provided therein and an upper surface of the metal layer 85 having the porous body provided therein. Also, the X direction of the flow path 50 of the liquid pipe 40 is demarcated by side surfaces of the metal layer 83 having no porous body and side surfaces of the metal layer 84 having no porous body.

The metal layer 82 has the first porous body 820 in a substantial center in the X direction and wall parts 82w on outermore sides than the first porous body 820. The first porous body 820 is continuously formed integrally with the wall parts 82w.

The metal layer 83 has one through-hole 51 penetrating in the thickness direction and wall parts 83w on outermore sides than the through-hole 51. The through-hole 51 forms a part of the flow path 50. Also, the wall parts 83w are right and left wall surfaces of the flow path 50.

The metal layer 84 has one through-hole 52 penetrating in the thickness direction and wall parts 84w on outermore sides than the through-hole 52. The through-hole 52 forms a part of the flow path 50. The through-hole 52 is formed to communicate with the through-hole 51 of the metal layer 83. The through-hole 51 and the through-hole 52 form the flow path 50. Also, the wall parts 84w are in contact with the wall parts 83w of the metal layer 83 and are right and left wall surfaces of the flow path 50.

The metal layer 85 has the second porous body 850 in a substantial center in the X direction and wall parts 85w on outermore sides than the second porous body 850. The second porous body 850 is continuously formed integrally with the wall parts 85w. The wall parts 82w of the metal layer 82 and the wall parts 85w of the metal layer 85 are respectively in contact with the wall parts 83w of the metal layer 83 and the wall parts 84w of the metal layer 84.

The first porous body 820 is formed with bottomed holes 82x recessed from an upper surface of the metal layer 82 to a substantially central part in the thickness direction and bottomed holes 82y recessed from a lower surface of the metal layer 82 to a substantially central part in the thickness direction. In the first porous body 820, the bottomed holes 82x and the bottomed holes 82y are formed to communicate with each other. Also, the bottomed holes 82y are formed to communicate with the flow path 50.

The bottomed holes 82x and the bottomed holes 82y are alternately arranged in the X direction, as seen from above. Also, the bottomed holes 82x and the bottomed holes 82y are alternately arranged in the Y direction, as seen from above. The bottomed holes 82x and the bottomed holes 82y alternately arranged in the X direction are partially overlapped, as seen from above, and the overlapping portions communicate with each other, thereby forming fine pores 82z, such as interstices or channels between adjacent bottomed holes 82x and 82y to form interconnected cavities. The bottomed holes 82x and the bottomed holes 82y alternately arranged in the Y direction are partially overlapped, as seen from above, and the overlapping portions communicate with each other, thereby forming fine pores 82z.

The bottomed holes 82x and 82y may be formed into a circular shape having a diameter of about 100 μm to 300 μm, for example, as seen from above. However, the bottomed holes may be formed to have any shape such as an elliptical shape, a polygonal shape and the like. A depth of each of the bottomed holes 82x and 82y may be set to about a half of a thickness of the metal layer 82, for example. An interval $L_1$ between the bottomed holes 82x adjacent to each other in the X direction may be set to about 100 μm to 400 μm, for example. An interval between the bottomed holes 82x adjacent to each other in the Y direction may be set in the same manner. An interval $L_2$ between the bottomed holes 82y adjacent to each other in the X direction may be set to about 100 μm to 400 μm, for example. An interval between the bottomed holes 82y adjacent to each other in the Y direction may be set in the same manner.

The bottomed holes 82x and 82y may be respectively formed into a concave shape in which an inner wall surface is a curved surface, for example. As the concave shape of which an inner wall surface is a curved surface, a concave shape of which a sectional shape is substantially semicircular or substantially semi-elliptical may be exemplified. Here, the substantially semicircular shape includes a semicircle obtained by bisecting a true circle, and one of which a circular arc is longer or shorter than the semicircle, for example. Also, the substantially semi-elliptical shape includes a semi-ellipse obtained by bisecting an ellipse and one of which a circular arc is longer or shorter than the semi-ellipse, for example.

A width $W_3$ of the fine pore 82z in the width direction may be set to about 10 μm to 50 μm, for example. Also, a width $W_4$ of the fine pore 82z in a longitudinal direction may be set to about 50 μm to 150 μm, for example.

The fine pores 82z formed in the metal layer 82 are spread two-dimensionally in the first porous body 820. For this reason, the operating fluid C can be spread two-dimensionally by capillary force.

The second porous body 850 is formed with bottomed holes 85x recessed from an upper surface of the metal layer 85 to a substantially central part in the thickness direction and bottomed holes 85y recessed from a lower surface of the metal layer 85 to a substantially central part in the thickness direction. In the second porous body 850, the bottomed holes 85x and the bottomed holes 85y are formed to communicate with each other. Also, the bottomed holes 85x are formed to communicate with the flow path 50.

The bottomed holes 85x and the bottomed holes 85y are alternately arranged in the X direction, as seen from above. Also, the bottomed holes 85x and the bottomed holes 85y are alternately arranged in the Y direction, as seen from above. The bottomed holes 85x and the bottomed holes 85y alternately arranged in the X direction are partially overlapped, as seen from above, and the overlapping portions communicate with each other, thereby forming fine pores 85z, such as interstices or channels between adjacent bottomed holes 85x and 85y to form interconnected cavities. The bottomed holes 85x and the bottomed holes 85y alternately arranged in the Y direction are partially overlapped, as seen from above, and the overlapping portions communicate with each other, thereby forming fine pores 85z. The shapes and the like of the bottomed holes 85x and 85y and the fine pore 85z may be formed to be similar to the shapes and the like of the bottomed holes 82x and 82y and the fine pore 82z, for example.

The fine pores 85z formed in the metal layer 85 are spread two-dimensionally in the second porous body 850. For this reason, the operating fluid C can be spread two-dimensionally by the capillary force.

In FIG. 3B, the bottomed hole 82x and the bottomed hole 85x, and the bottomed hole 82y and the bottomed hole 85y are overlapped, as seen from above. However, the present disclosure is not limited thereto. That is, the bottomed hole 82x and the bottomed hole 85x may not be necessarily overlapped, as seen from above, inasmuch as the fine pores 82z are spread two-dimensionally in the first porous body 820 and the fine pores 85z are spread two-dimensionally in the second porous body 850. Also, the bottomed hole 82y and the bottomed hole 85y may not be necessarily overlapped, as seen from above.

Figure 4:
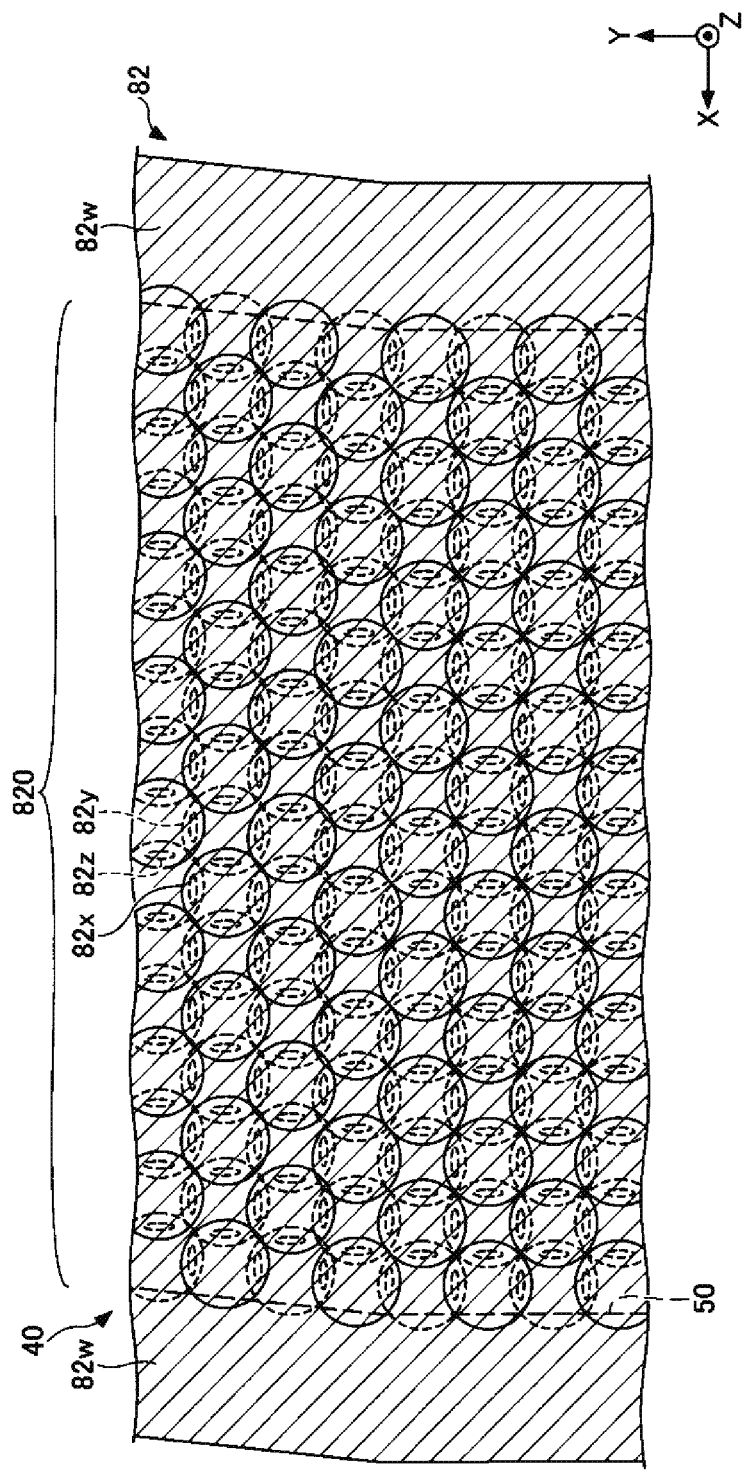
FIG. 4 is a view illustrating the flow path and porous body provided in the liquid pipe in accordance with the exemplary embodiment (2 thereof).

FIG. 4 is a view illustrating the flow path and porous body provided in the liquid pipe in accordance with the exemplary embodiment (2 thereof), and is a partial plan view corresponding to FIG. 3A. As shown in FIG. 4, in a case in which the liquid pipe 40 is bent or curved, the first porous body 820 and the second porous body 850 may be provided along the liquid pipe 40.

[Manufacturing Method of Loop-Type Heat Pipe of Exemplary Embodiment]

Subsequently, a manufacturing method of the loop-type heat pipe in accordance with the exemplary embodiment is described, focusing on a manufacturing process of the porous body. FIGS. 5A to 6B illustrate a manufacturing process of the loop-type heat pipe in accordance with the exemplary embodiment, and show sectional views corresponding to FIG. 3B.

Figure 5A:
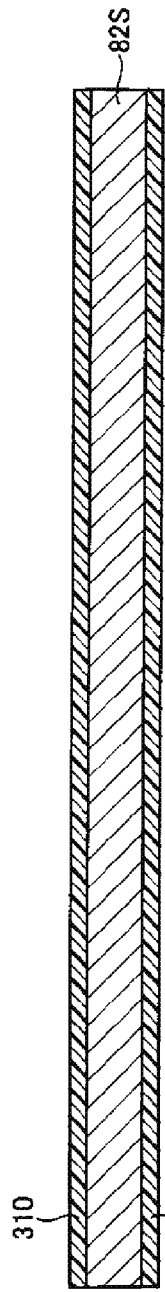
FIGS. 5A to 5D are views illustrating a manufacturing process of the loop-type heat pipe in accordance with the exemplary embodiment (1 thereof).

First, in a process shown in FIG. 5A, a metal sheet 82S formed into a planar shape of FIG. 1 is prepared. Then, a resist layer 310 is formed on an upper surface of the metal sheet 82S, and a resist layer 320 is formed on a lower surface of the metal sheet 82S. The metal sheet 82S is a member that is finally to be the metal layer 82, and may be formed of, for example, copper, stainless steel, aluminum, magnesium alloy or the like. A thickness of the metal sheet 82S may be set to about 50 μm to 200 μm, for example. As the resist layers 310 and 320, a photosensitive dry film resist or the like may be used, for example.

Figure 5B:
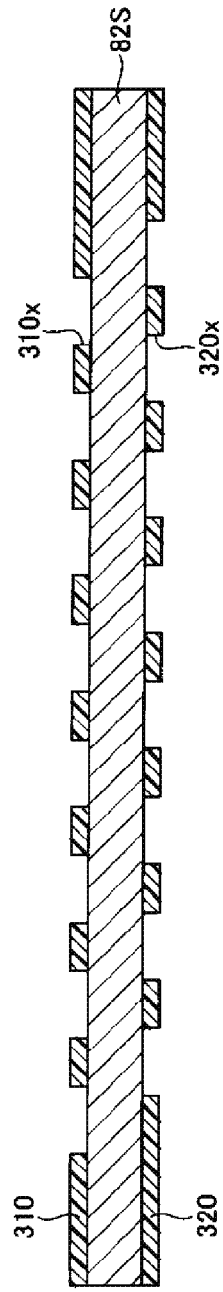

Subsequently, in a process shown in FIG. 5B, the resist layer 310 is exposed and developed to form openings 310x for selectively exposing the upper surface of the metal sheet 82S, in a region of the metal sheet 82S in which the first porous body 820 is to be formed. Also, the resist layer 320 is exposed and developed to form openings 320x for selectively exposing the lower surface of the metal sheet 82S. The openings 310x are formed and arranged so as to correspond to the shape and arrangement of the bottomed holes 82x shown in FIG. 3B. Also, the openings 320x are formed and arranged so as to correspond to the shape and arrangement of the bottomed holes 82y shown in FIG. 3B.

Figure 5C:
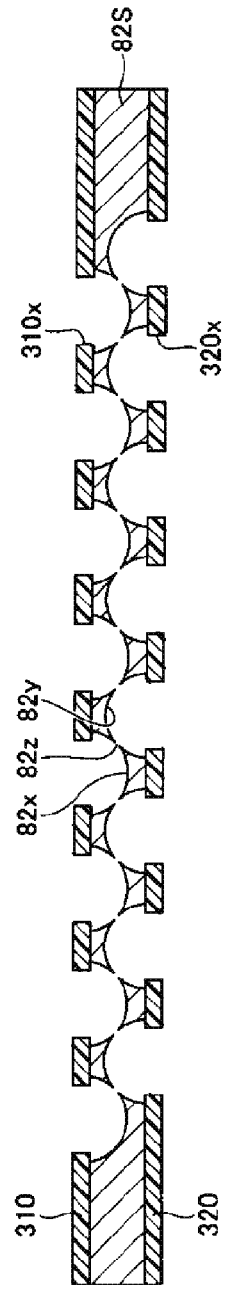

Subsequently, in a process shown in FIG. 5C, the metal sheet 82S exposed into the openings 310x is half-etched from the upper surface of the metal sheet 82S, and the metal sheet 82S exposed into the openings 320x is half-etched from the lower surface of the metal sheet 82S. Thereby, the bottomed holes 82x are formed in the upper surface of the metal sheet 82S, and the bottomed holes 82y are formed in the lower surface. Also, since the openings 310x and the openings 320x alternately arranged in the X direction in the front and back surfaces are partially overlapped, as seen from above, the overlapping portions communicate with each other, thereby forming the fine pores 82z. When half etching the metal sheet 82S, a ferric chloride solution may be used, for example.

Figure 5D:
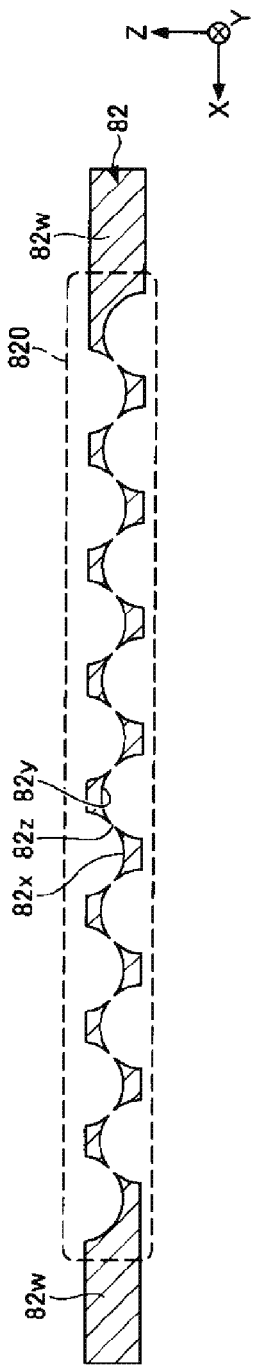

Subsequently, in a process shown in FIG. 5D, the resist layers 310 and 320 are removed by a removing solution. Thereby, the metal layer 82 having the first porous body 820 in the substantial center in the X direction and the wall parts 82w on the outermore sides than the first porous body 820 is completed.

Figure 6A:
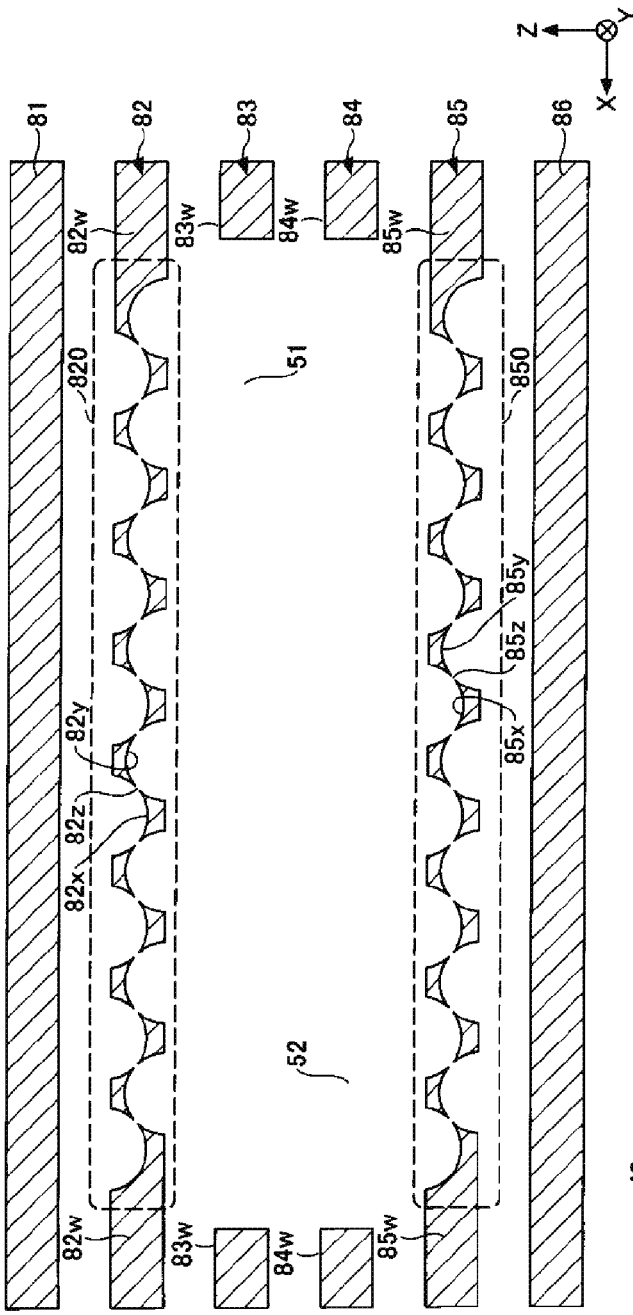
FIGS. 6A and 6B are views illustrating the manufacturing process of the loop-type heat pipe in accordance with the exemplary embodiment (2 thereof).

Subsequently, in a process shown in FIG. 6A, solid metal layers 81 and 86 having no holes and no grooves are prepared. Also, a metal sheet is prepared, and a region that is to be the flow path 50 is removed by etching, so that the metal layer 83 having one through-hole 51 penetrating in the thickness direction and the wall parts 83w on the outermore sides than the through-hole 51 is formed. Also, a metal sheet is prepared, and a region that is to be the flow path 50 is removed by etching, so that the metal layer 84 having one through-hole 52 penetrating in the thickness direction and the wall parts 84w on the outermore sides than the through-hole 52 is formed. Also, the metal layer 85 having the second porous body 850 in the substantial center in the X direction and the wall parts 85w on the outermore sides than the second porous body 850 is formed by the same method as the metal layer 82. The positions of the bottomed holes and the fine pores formed in the metal layer 85 are as shown in FIG. 3B, for example.

Figure 6B:
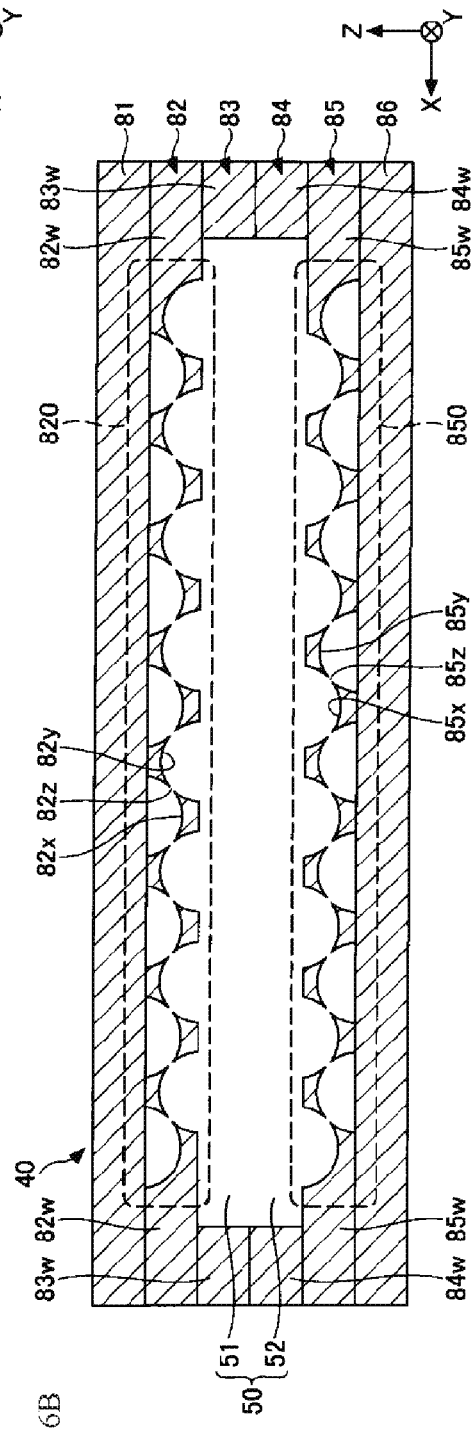

Subsequently, in a process shown in FIG. 6B, the respective metal layers are stacked in order shown in FIG. 6A, and are then pressurized and heated for solid-phase bonding. Thereby, the metal layers adjacent to each other are directly bonded, so that the loop-type heat pipe 1 including the evaporator 10, the condenser 20, the vapor pipe 30 and the liquid pipe 40 is completed. Also, the through-hole 51 and the through-hole 52 communicate with each other, so that the flow path 50 is formed in the liquid pipe 40. Thereafter, the liquid pipe 40 is exhausted by using a vacuum pump and the like, and the operating fluid C is injected from the inlet 60 into the liquid pipe 40. Thereafter, the inlet 60 is sealed.

Here, the solid-phase bonding is a method of heating and softening targets to be bonded in a solid-phase (solid) state without melting the same, and further pressurizing, plastically deforming and bonding the same. In the meantime, all materials of the metal layers 81 to 86 are preferably the same so that the metal layers adjacent to each other can be favorably bonded by the solid-phase bonding.

In this way, in the liquid pipe 40 of the loop-type heat pipe 1, the metal layer 82 configuring the upper wall surface of the flow path 50 is provided with the first porous body 820, and the metal layer 85 configuring the lower wall surface of the flow path 50 is provided with the second porous body 850. That is, unlike the loop-type heat pipe of the related art, the pillar-shaped porous body dividing the flow path in two is not provided in the vicinity of the central part in the liquid pipe.

Thereby, in the liquid pipe 40, it is possible to configure a single space that is to be the flow path 50, and the space sectional area of the flow path 50 is widened, so that it is possible to reduce the pressure loss and to improve the flowability of the operating fluid C when the operating fluid C flows.

Also, in a structure in which the pillar-shaped porous body is provided, like the loop-type heat pipe of the related art, when a width of the flow path in the liquid pipe is narrow, it is not possible to sufficiently secure a region in which the porous body can be arranged. Accompanied by this, the reflux of the operating fluid in the liquid pipe is stagnant, and the loop-type heat pipe does not normally operate. In contrast, since the liquid pipe 40 of the loop-type heat pipe 1 is not provided with the pillar-shaped porous body, it is possible to sufficiently secure a region in which the porous body can be arranged, even in a case in which it is necessary to narrowly design the width of the flow path 50. As a result, it is possible to secure both the space sectional area of the flow path 50 and the reflex effect by the porous body, and to normally operate the loop-type heat pipe 1.

Also, in the structure in which the pillar-shaped porous body is provided, like the loop-type heat pipe of the related art, it is necessarily required to provide a link so as to have a contact point of the pillar-shaped porous body and the pipe wall at a predetermined place. However, the provision of the link lowers a degree of design freedom of each metal layer, reduces the space sectional area of the flow path and increases the pressure loss. In contrast, since the liquid pipe 40 of the loop-type heat pipe 1 is not provided with the pillar-shaped porous body, it is not necessary to provide the link. As a result, since the space sectional area of the flow path 50 is widened as a magnitude of the link, it is possible to reduce the pressure loss and to improve the flowability of the operating fluid C when the operating fluid C flows.

Also, a loop-type heat pipe in which an inside of the liquid pipe is entirely configured by a porous body and a flow path is not formed is suggested. However, when the inside of the liquid pipe is entirely configured by the porous body, force of attracting the operating fluid increases but the pressure loss increases unless a flow path is provided. As a result, the operating fluid is difficult to move. However, like the liquid pipe 40 of the exemplary embodiment, when the liquid pipe 40 is provided therein with the flow path 50, in addition to the first porous body 820 and the like, it is possible to increase the force of attracting the operating fluid to a predetermined degree or higher and to reduce the pressure loss, so that the operating fluid can easily flow.

First Modified Embodiment of Exemplary Embodiment

In a first modified example of the exemplary embodiment, an example in which the porous body is partially arranged is described. Meanwhile, in the first modified example of the exemplary embodiment, the descriptions of the same configurations as the exemplary embodiment may be omitted.

Figure 7:
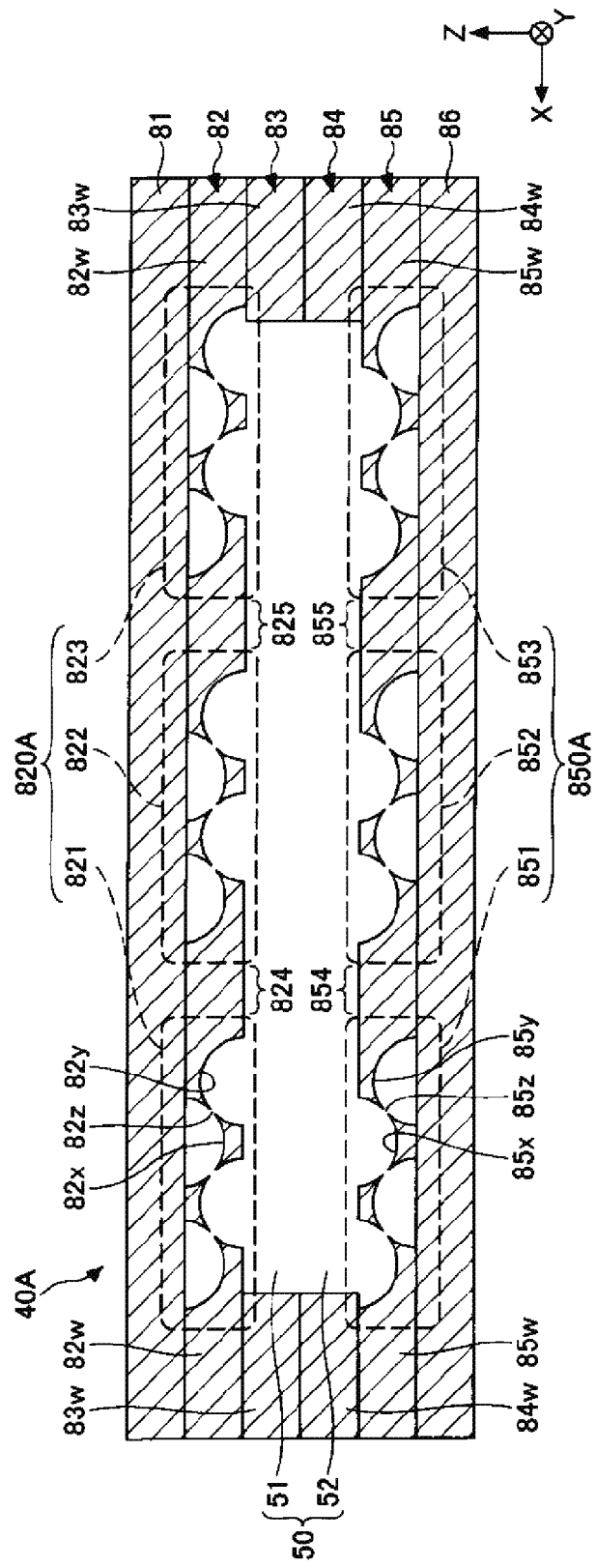
FIG. 7 is a view illustrating a flow path and a porous body provided in a liquid pipe in accordance with a first modified example of the exemplary embodiment (1 thereof).

FIG. 7 is a view illustrating a flow path and a porous body provided in a liquid pipe in accordance with the first modified example of the exemplary embodiment (1 thereof).

A liquid pipe 40A shown in FIG. 7 has a first porous body 820A provided in the metal layer 82 so as to face the flow path 50 and a second porous body 850A provided in the metal layer 85 so as to face the flow path 50. The intermediate metal layers are not provided with a porous body. That is, the metal layers 83 and 84 are not provided with a porous body.

The first porous body 820A is partially arranged in a region of the metal layer 82 that faces the flow path 50. Specifically, the first porous body 820A has a first region 821, a second region 822, and a third region 823 arranged with being spaced from each other in the metal layer 82. Also, a fourth region 824 having no porous body is provided between the first region 821 and the second region 822 in the metal layer 82. Also, a fifth region 825 having no porous body is provided between the second region 822 and the third region 823 in the metal layer 82.

The first region 821, the second region 822, and the third region 823 are respectively formed with bottomed holes 82x recessed from an upper surface of the metal layer 82 to a substantially central part in the thickness direction and bottomed holes 82y recessed from a lower surface of the metal layer 82 to a substantially central part in the thickness direction. In the first region 821, the second region 822 and the third region 823, the bottomed holes 82x and the bottomed holes 82y are formed to communicate with each other. Also, the bottomed holes 82y are formed to communicate with the flow path 50.

The second porous body 850A is partially arranged in a region of the metal layer 85 that faces the flow path 50. Specifically, the second porous body 850A has a first region 851, a second region 852, and a third region 853 arranged with being spaced from each other in the metal layer 85. Also, a fourth region 854 having no porous body is provided between the first region 851 and the second region 852 in the metal layer 85. Also, a fifth region 855 having no porous body is provided between the second region 852 and the third region 853 in the metal layer 85.

The first region 851, the second region 852, and the third region 853 are respectively formed with bottomed holes 85x recessed from an upper surface of the metal layer 85 to a substantially central part in the thickness direction and bottomed holes 85y recessed from a lower surface of the metal layer 85 to a substantially central part in the thickness direction. In the first region 851, the second region 852 and the third region 853, the bottomed holes 85x and the bottomed holes 85y are formed to communicate with each other. Also, the bottomed holes 85x are formed to communicate with the flow path 50.

Figure 8:
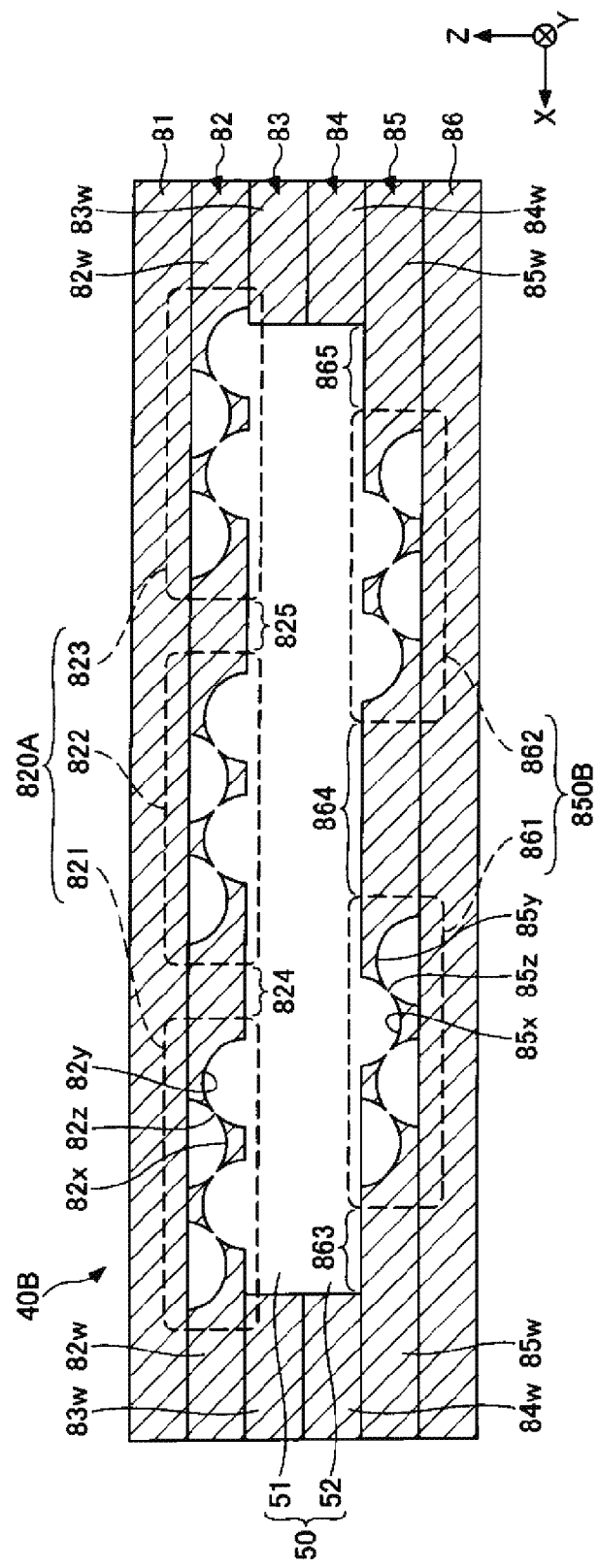
FIG. 8 is a view illustrating a flow path and a porous body provided in a liquid pipe in accordance with the first modified example of the exemplary embodiment (2 thereof).

FIG. 8 is a view illustrating a flow path and a porous body provided in a liquid pipe in accordance with the first modified example of the exemplary embodiment (2 thereof).

A liquid pipe 40B shown in FIG. 8 is different from the liquid pipe 40A (refer to FIG. 7), in that the second porous body 850A is replaced with a second porous body 850B.

The second porous body 850B has a first region 861 and a second region 862 arranged with being spaced from each other in the metal layer 85. Also, in the metal layer 85, a left side (a negative direction in the X axis) of the drawing sheet of the first region 861 is provided with a third region 863 having no porous body. Also, in the metal layer 85, a fourth region 864 having no porous body is provided between the first region 861 and the second region 862. Also, in the metal layer 85, a right side (a positive direction in the X axis) of the drawing sheet of the second region 862 is provided with a fifth region 865 having no porous body. The bottomed holes 85x and 85y and fine pores 85z formed in the first region 861 and the second region 862 have the similar structures to the second porous body 850A.

As shown in FIGS. 7 and 8, the first porous body 820A may be partially arranged in the region of the metal layer 85 that faces the flow path 50. Also, the second porous body 850A (or the second porous body 850B) may be partially arranged in the region of the metal layer 85 that faces the flow path 50. Also in the case, the first porous body 820A and the second porous body 850A (or the second porous body 850B) can guide the reflux of the operating fluid. Also, regions, in which the porous body is not arranged, of the metal layers 82 and 85 are reinforcements for preventing deformation of the liquid pipe 40.

In the meantime, a position in which the porous body is to be arranged may be arbitrarily determined. For example, as shown in FIG. 7, the porous bodies may be arranged in the same positions of the metal layer 82 and the metal layer 85. Alternatively, as shown in FIG. 8, the porous bodies may be arranged in the different positions of the metal layer 82 and the metal layer 85. Also, the number of regions, in which the porous body is not arranged, of the metal layers 82 and 85 may be arbitrarily determined, depending on a degree of required reinforcement, and the like.

Also, if necessary, the porous body may be entirely arranged in one metal layer of the metal layer 82 and the metal layer 85 and the porous body may be partially arranged in the other metal layer.

Second Modified Embodiment of Exemplary Embodiment

In a second modified example of the exemplary embodiment, an example in which the intermediate metal layer is formed with grooves for widening the width of the flow path in the right and left direction is described. Meanwhile, in the second modified example of the exemplary embodiment, the descriptions of the same configurations as the embodiments may be omitted.

Figure 9A:
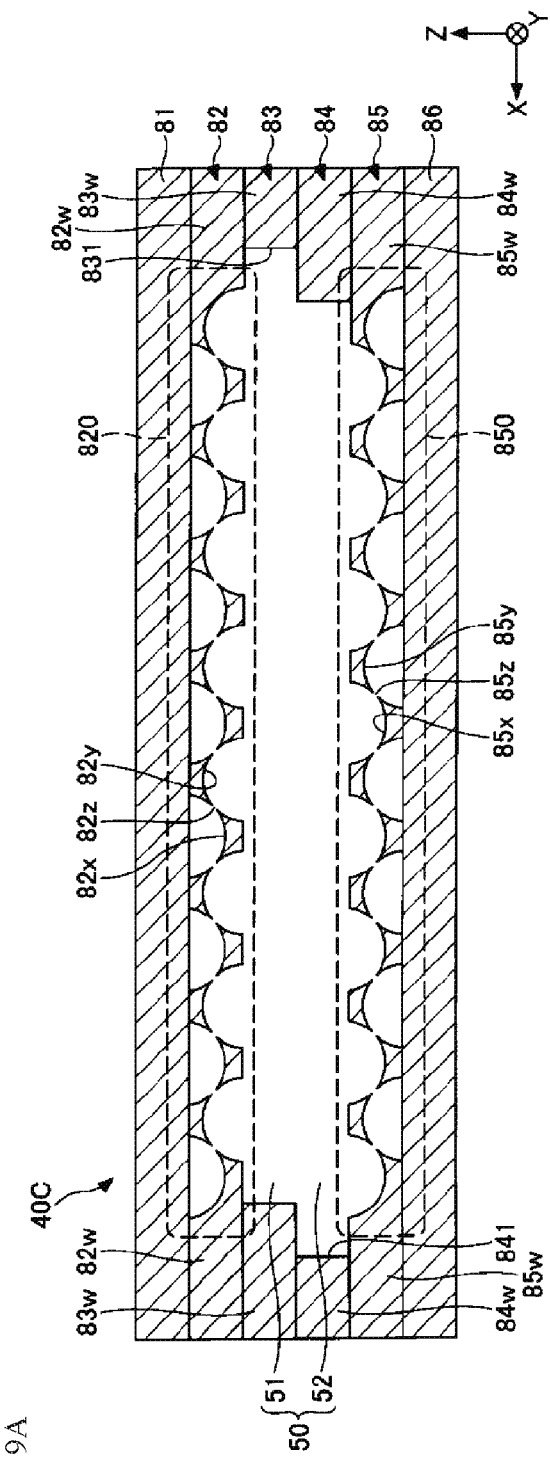
FIGS. 9A and 9B are views illustrating a flow path and a porous body provided in a liquid pipe in accordance with a second modified example of the exemplary embodiment (1 thereof).
Figure 9B:
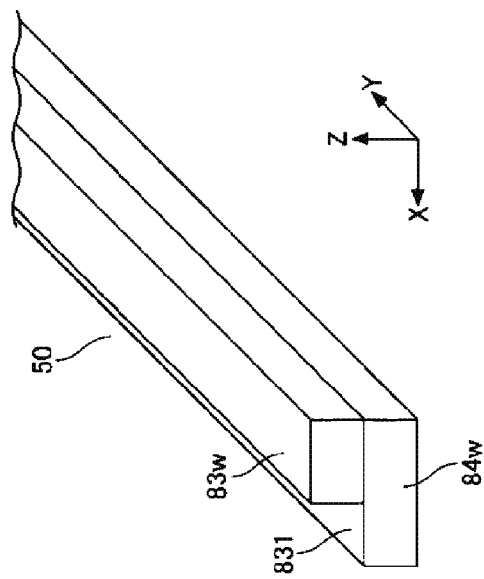

FIGS. 9A and 9B are views illustrating a flow path and a porous body provided in a liquid pipe in accordance with the second modified example of the exemplary embodiment (1 thereof), in which FIG. 9A is a sectional view corresponding to FIG. 3B and FIG. 9B is a partial perspective view in the vicinity of a groove 831 of FIG. 9A.

A liquid pipe 40C shown in FIG. 9A is different from the liquid pipe 40 (refer to FIG. 3B), in that the metal layer 83 is formed with a groove 831 and the metal layer 84 is formed with a groove 841. In the meantime, the metal layers 83 and 84 are formed with the grooves but are not provided with the porous body.

The groove 831 is formed as a linear groove extending along the flow path 50 of the liquid pipe 40C. The groove 831 is formed as a through-groove penetrating from the upper surface of the metal layer 83 to the lower surface. The groove 831 is formed by changing a width (length in the X direction) of the wall part 83w of the metal layer 83 configuring the wall surface of the flow path 50, for example. In the modified example shown in FIG. 9A, the width of the wall part 83w of the metal layer 83 is made smaller than the width of the wall part 84w of the metal layer 84, so that the groove 831 is formed. In other words, a side surface of the wall part 83w of the metal layer 83 exposed to the flow path 50 is located in a position more recessed than a side surface of the wall part 84w of the metal layer 84 exposed to the flow path 50. The groove 831 is formed to communicate with the flow path 50, and widens the width of the flow path 50 in the right direction (a positive direction in the X axis). A sectional shape of the groove 831 may be rectangular, for example. The groove 831 may be formed by press working or etching, for example.

The groove 841 is formed as a linear groove extending along the flow path 50 of the liquid pipe 40C. The groove 841 is formed as a through-groove penetrating from the upper surface of the metal layer 84 to the lower surface. The groove 841 is formed by changing a width (length in the X direction) of the wall part 84w of the metal layer 84 configuring the wall surface of the flow path 50, for example. In the modified example shown in FIG. 9A, the width of the wall part 84w of the metal layer 84 is made smaller than the width of the wall part 83w of the metal layer 83, so that the groove 841 is formed. In other words, a side surface of the wall part 84w of the metal layer 84 exposed to the flow path 50 is located in a position more recessed than a side surface of the wall part 83w of the metal layer 83 exposed to the flow path 50. The groove 841 is formed to communicate with the flow path 50, and widens the width of the flow path 50 in the left direction (a negative direction in the X axis). A sectional shape of the groove 841 may be rectangular, for example. The groove 841 may be formed by press working or etching, for example. The formation of the groove 831 and the groove 841 may be appropriately changed.

In the meantime, the groove 831 and the groove 841 are not formed by the plurality of bottomed holes communicating with each other, like the porous body, but are one concave portion formed continuously along the wall surfaces of the flow path 50, respectively. The other grooves (grooves 832, 833, 834, 835, 842, 843, 844 and 845 shown in FIGS. 10 and 11) to be described later are also the same.

In this way, in the liquid pipe 40C, the metal layer 83 is formed with the groove 831 and the metal layer 84 is formed with the groove 841, so that the width of the flow path 50 can be widened in the right and left direction, as compared to the liquid pipe 40 (refer to FIG. 3B). Thereby, it is possible to reduce the pressure loss when the operating fluid C flows in the flow path 50. Also, since the grooves 831 and 841 have a function of sucking up the operating fluid C, like the first porous body 820 and the second porous body 850, it is possible to improve the ability to guide the operating fluid C.

Figure 10:
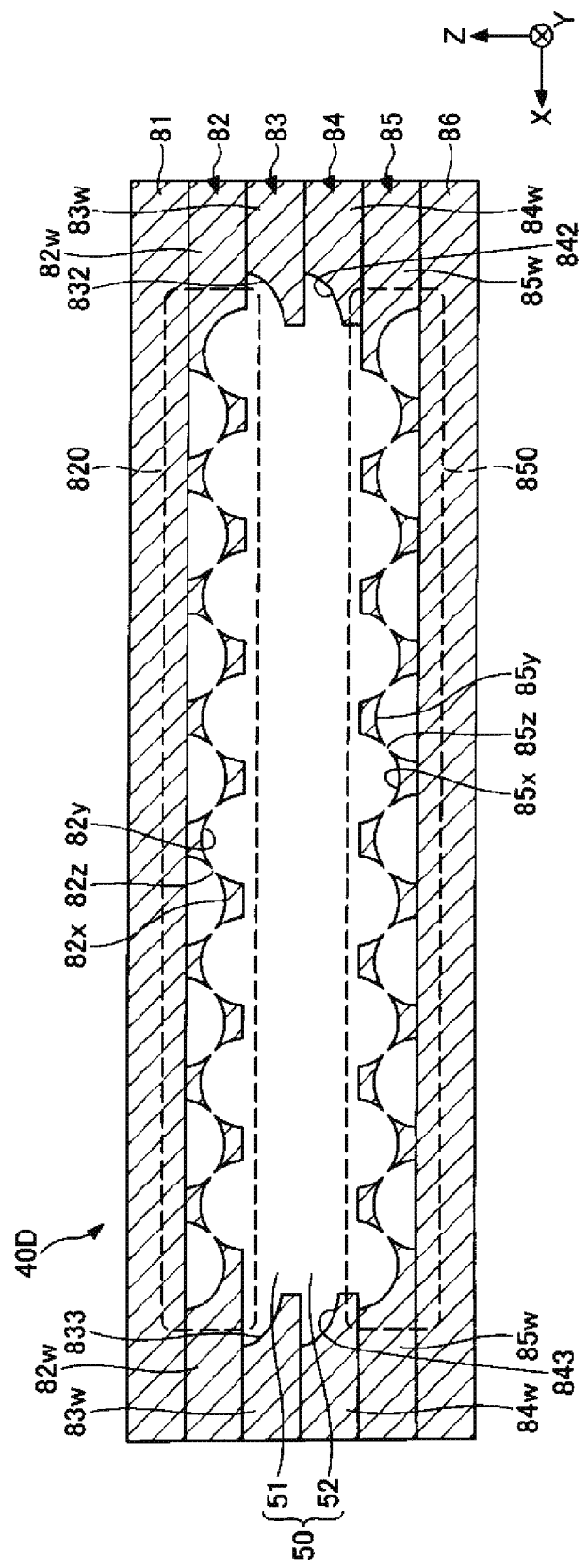
FIG. 10 is a view illustrating a flow path and a porous body provided in a liquid pipe in accordance with the second modified example of the exemplary embodiment (2 thereof).

FIG. 10 is a view illustrating a flow path and a porous body provided in a liquid pipe in accordance with the second modified example of the exemplary embodiment (2 thereof), and is a sectional view corresponding to FIG. 3B.

A liquid pipe 40D shown in FIG. 10 is different from the liquid pipe 40 (refer to FIG. 3B), in that the metal layer 83 is formed with grooves 832 and 833 and the metal layer 84 is formed with grooves 842 and 843. In the meantime, the metal layers 83 and 84 are provided with the grooves but are not provided with the porous body.

The groove 832 is a bottomed groove recessed from the upper surface of the metal layer 83 toward the lower surface, and is formed into a linear shape along the right wall surface (one wall surface in the X direction) of the flow path 50. The groove 832 is formed to communicate with the flow path 50, and widens the width of the flow path 50 in the right direction (a positive direction in the X axis). The groove 832 may be formed so that a side communicating with the flow path 50 is deepest and becomes shallower away from the flow path 50, for example. A sectional shape of the groove 832 may be semicircular or semi-elliptical, for example. The groove 832 may be formed by half etching, for example.

The groove 833 is a bottomed groove recessed from the upper surface of the metal layer 83 toward the lower surface, and is formed into a linear shape along the left wall surface (the other wall surface in the X direction) of the flow path 50. The groove 833 is formed to communicate with the flow path 50, and widens the width of the flow path 50 in the left direction (a negative direction in the X axis). The groove 833 may be formed so that a side communicating with the flow path 50 is deepest and becomes shallower away from the flow path 50, for example. A sectional shape of the groove 833 may be semicircular or semi-elliptical, for example. The groove 833 may be formed by half etching, for example.

The groove 842 is a bottomed groove recessed from the upper surface of the metal layer 84 toward the lower surface, and is formed into a linear shape along the right wall surface (one wall surface in the X direction) of the flow path 50. The groove 842 is formed to communicate with the flow path 50, and widens the width of the flow path 50 in the right direction (a positive direction in the X axis). The groove 842 may be formed so that a side communicating with the flow path 50 is deepest and becomes shallower away from the flow path 50, for example. A sectional shape of the groove 842 may be semicircular or semi-elliptical, for example. The groove 842 may be formed by half etching, for example.

The groove 843 is a bottomed groove recessed from the upper surface of the metal layer 84 toward the lower surface, and is formed into a linear shape along the left wall surface (the other wall surface in the X direction) of the flow path 50. The groove 843 is formed to communicate with the flow path 50, and widens the width of the flow path 50 in the left direction (a negative direction in the X axis). The groove 843 may be formed so that a side communicating with the flow path 50 is deepest and becomes shallower away from the flow path 50, for example. A sectional shape of the groove 843 may be semicircular or semi-elliptical, for example. The groove 833 may be formed by half etching, for example.

In this way, in the liquid pipe 40D, the metal layer 83 is formed with the grooves 832 and 833 and the metal layer 84 is formed with the grooves 842 and 843, so that the width of the flow path 50 can be widened in the right and left direction (X direction), as compared to the liquid pipe 40 (refer to FIG. 3B). Thereby, it is possible to reduce the pressure loss when the operating fluid C flows in the flow path 50. Also, since the grooves 832 and 833, 842 and 843 have a function of sucking up the operating fluid C, like the first porous body 820 and the second porous body 850, it is possible to improve the ability to guide the operating fluid C.

Figure 11:
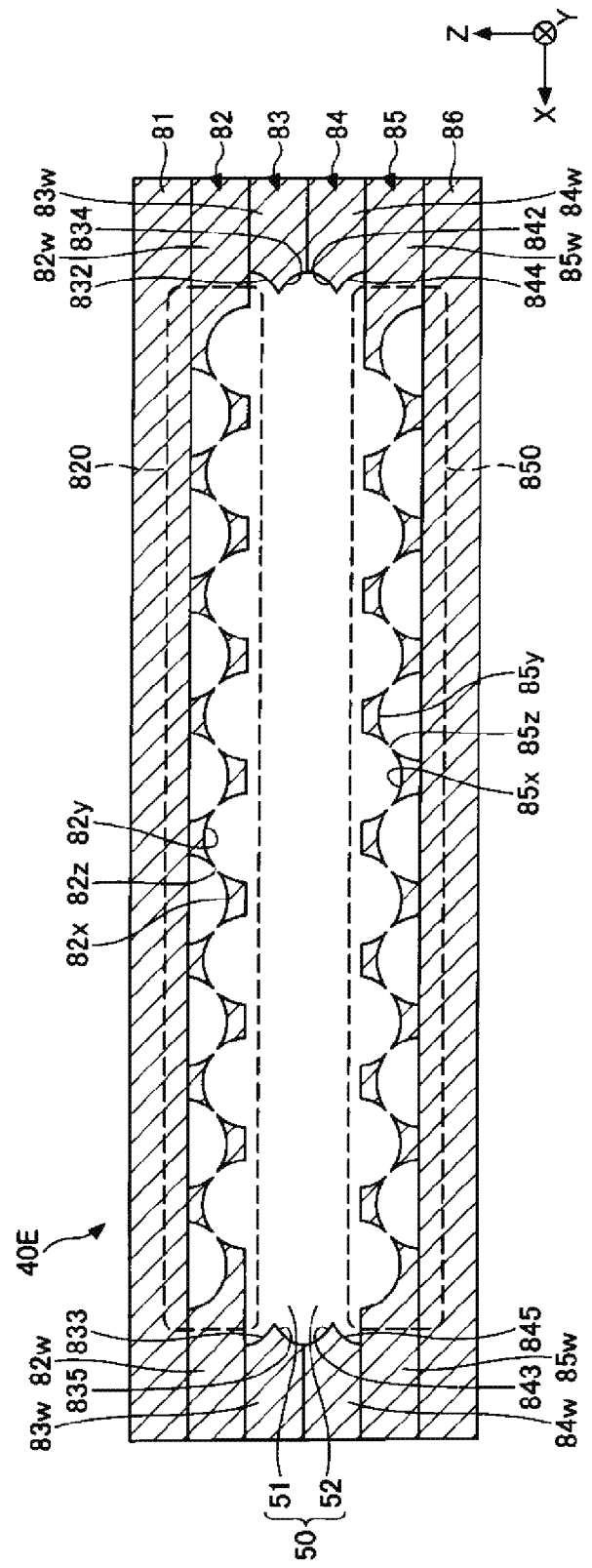
FIG. 11 is a view illustrating a flow path and a porous body provided in a liquid pipe in accordance with the second modified example of the exemplary embodiment (3 thereof).

FIG. 11 is a view illustrating a flow path and a porous body provided in a liquid pipe in accordance with the second modified example of the exemplary embodiment (3 thereof), and is a sectional view corresponding to FIG. 3B.

A liquid pipe 40E shown in FIG. 11 is different from the liquid pipe 40 (refer to FIG. 3B), in that the metal layer 83 is formed with grooves 832, 833, 834, and 835 and the metal layer 84 is formed with grooves 842, 843, 844 and 845. In the meantime, the metal layers 83 and 84 are provided with the grooves, but are not provided with the porous body.

The structures of the grooves 832, 833, 842 and 843 are similar to the case of the liquid pipe 40D (refer to FIG. 10).

The groove 834 is a bottomed groove recessed from the lower surface of the metal layer 83 toward the upper surface, and is formed into a linear shape along the right wall surface (one wall surface in the X direction) of the flow path 50. The groove 834 is formed to communicate with the flow path 50, and widens the width of the flow path 50 in the right direction (a positive direction in the X axis). Also, the groove 834 is formed to communicate with the grooves 832 and 842. The groove 834 may be formed so that a side communicating with the flow path 50 is deepest and becomes shallower away from the flow path 50, for example. A sectional shape of the groove 834 may be semicircular or semi-elliptical, for example. The groove 834 may be formed by half etching, for example.

The groove 835 is a bottomed groove recessed from the lower surface of the metal layer 83 toward the upper surface, and is formed into a linear shape along the left wall surface (the other wall surface in the X direction) of the flow path 50. The groove 835 is formed to communicate with the flow path 50, and widens the width of the flow path 50 in the left direction (a negative direction in the X axis). Also, the groove 835 is formed to communicate with the grooves 833 and 843. The groove 835 may be formed so that a side communicating with the flow path 50 is deepest and becomes shallower away from the flow path 50, for example. A sectional shape of the groove 835 may be semicircular or semi-elliptical, for example. The groove 835 may be formed by half etching, for example.

The groove 844 is a bottomed groove recessed from the lower surface of the metal layer 84 toward the upper surface, and is formed into a linear shape along the right wall surface (one wall surface in the X direction) of the flow path 50. The groove 844 is formed to communicate with the flow path 50, and widens the width of the flow path 50 in the right direction (a positive direction in the X axis). Also, the groove 844 is formed to communicate with the groove 842. The groove 844 may be formed so that a side communicating with the flow path 50 is deepest and becomes shallower away from the flow path 50, for example. A sectional shape of the groove 844 may be semicircular or semi-elliptical, for example. The groove 844 may be formed by half etching, for example.

The groove 845 is a bottomed groove recessed from the lower surface of the metal layer 84 toward the upper surface, and is formed into a linear shape along the left wall surface (the other wall surface in the X direction) of the flow path 50. The groove 845 is formed to communicate with the flow path 50, and widens the width of the flow path 50 in the left direction (a negative direction in the X axis). Also, the groove 845 is formed to communicate with the groove 843. The groove 845 may be formed so that a side communicating with the flow path 50 is deepest and becomes shallower away from the flow path 50, for example. A sectional shape of the groove 845 may be semicircular or semi-elliptical, for example. The groove 845 may be formed by half etching, for example.

In this way, in the liquid pipe 40E, the metal layer 83 is formed with the grooves 832, 833, 834, and 835 and the metal layer 84 is formed with the grooves 842, 843, 844 and 845, so that the width of the flow path 50 can be widened in the right and left direction (X direction), as compared to the liquid pipe 40 (refer to FIG. 3B). Thereby, it is possible to reduce the pressure loss when the operating fluid C flows in the flow path 50. Also, since the grooves 832, 833, 834 and 835 and the grooves 842, 843, 844 and 845 have a function of sucking up the operating fluid C, like the first porous body 820 and the second porous body 850, it is possible to improve the ability to guide the operating fluid C.

In the meantime, the more the shallow grooves are, the higher the function of sucking up the operating fluid C is. That is, the liquid pipe 40D (FIG. 10) has the higher function of sucking up the operating fluid C than the liquid pipe 40C (FIG. 9A), and the liquid pipe 40E (FIG. 11) has the higher function of sucking up the operating fluid C than the liquid pipe 40D (FIG. 10).

Third Modified Embodiment of Exemplary Embodiment

In a third modified example of the exemplary embodiment, an example in which the porous body extends from a region of the metal layer that faces the flow path to a region that does not face the flow path is described. Meanwhile, in the third modified example of the exemplary embodiment, the descriptions of the same configurations as the embodiments may be omitted.

Figure 12:
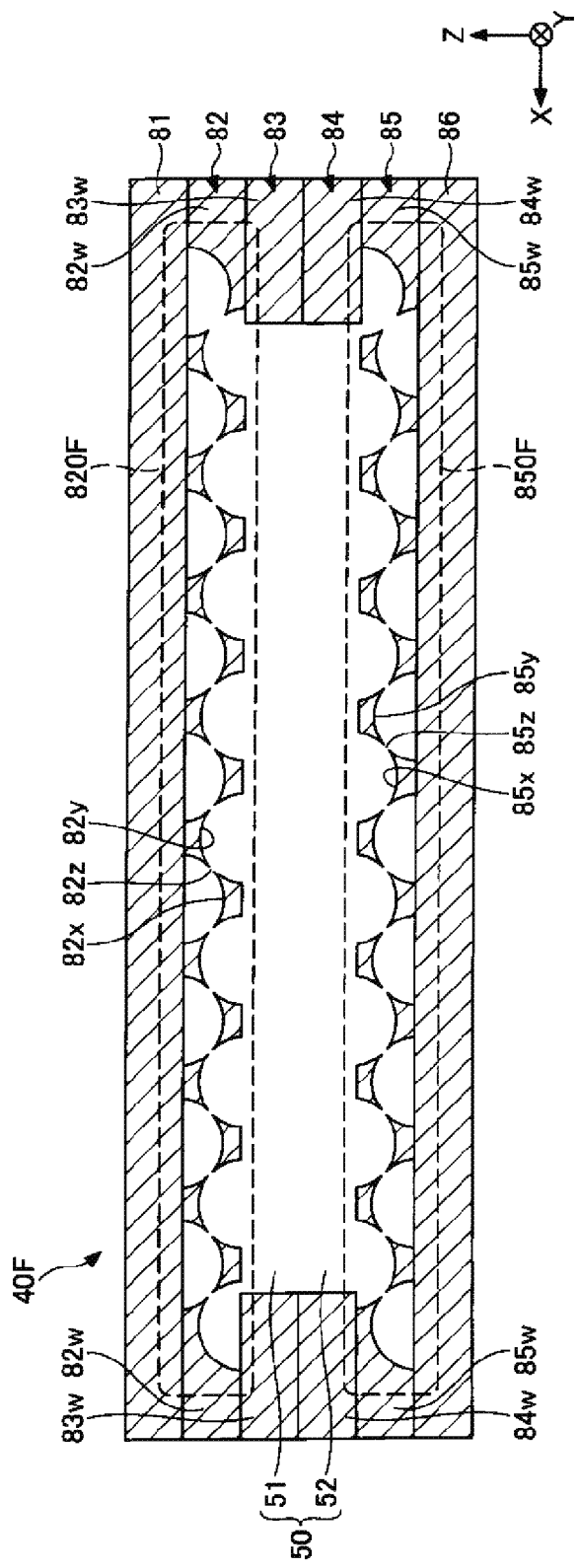
FIG. 12 is a view illustrating a flow path and a porous body provided in a liquid pipe in accordance with a third modified example of the exemplary embodiment.

FIG. 12 is a view illustrating a flow path and a porous body provided in a liquid pipe in accordance with the third modified example of the exemplary embodiment, and is a sectional view corresponding to FIG. 3B.

A liquid pipe 40F shown in FIG. 12 is different from the liquid pipe 40 (refer to FIG. 3B), in that the first porous body 820 is replaced with a first porous body 820F and the second porous body 850 is replaced with a second porous body 850F.

The first porous body 820F is configured by the bottomed holes 82x and 82y and the fine pores 82z, like the first porous body 820, but extends from a region of the metal layer 82 that faces the flow path 50 to a region that does not face the flow path 50 (a region located on an outermore side than the side surface of the wall part 83w of the metal layer 83), unlike the first porous body 820.

The second porous body 850F is configured by the bottomed holes 85x and 85y and the fine pores 85z, like the second porous body 850, but extends from a region of the metal layer 85 that faces the flow path 50 to a region that does not face the flow path 50 (a region located on an outermore side than the side surface of the wall part 84w of the metal layer 84), unlike the second porous body 850.

In this way, the first porous body 820F and the second porous body 850F may be formed to extend from the regions that face the flow path 50 to the regions that do not face the flow path 50. Alternatively, only one of the first porous body 820F and the second porous body 850F may be formed to extend from the region that faces the flow path 50 to the region that does not face the flow path 50.

Thereby, since the formation regions of the first porous body 820F and/or the second porous body 850F increase, it is possible to improve the ability to guide the operating fluid C.

Fourth Modified Embodiment of Exemplary Embodiment

In a fourth modified example of the exemplary embodiment, an example of variation in a sectional shape and a size of the bottomed hole is described. Meanwhile, in the fourth modified example of the exemplary embodiment, the descriptions of the same configurations as the embodiments may be omitted.

Figure 13A:
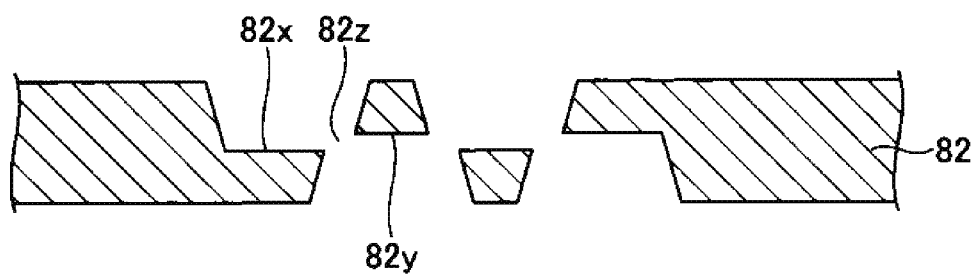
FIGS. 13A and 13B are views illustrating a modified example of a sectional shape of a bottomed hole.
Figure 13B:
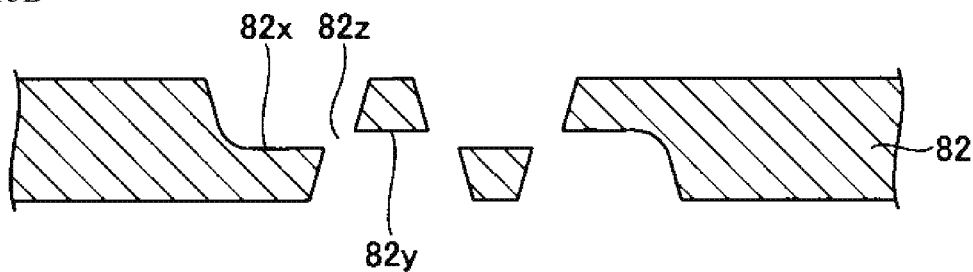

FIGS. 13A and 13B are views illustrating a modified example of a sectional shape of the bottomed hole. In the exemplary embodiment and the first to third modified examples, the bottomed holes 82x and 82y and the bottomed holes 85x and 85y are formed to have a concave shape of which a sectional shape is substantially semicircular or substantially semi-elliptical. However, the present disclosure is not limited thereto.

As shown in FIG. 13A, for example, the bottomed holes 82x and 82y may be formed to have a concave shape of which a sectional shape is a substantially trapezoidal shape having a width gradually increasing from a bottom surface toward an opening side. The bottomed holes 85x and 85y are also the same.

Also, as shown in FIG. 13B, for example, the bottomed holes 82x and 82y may be formed to have a shape of which an inner wall continues in a circular arc shape over a bottom surface. The bottomed holes 85x and 85y are also the same.

Figure 14:
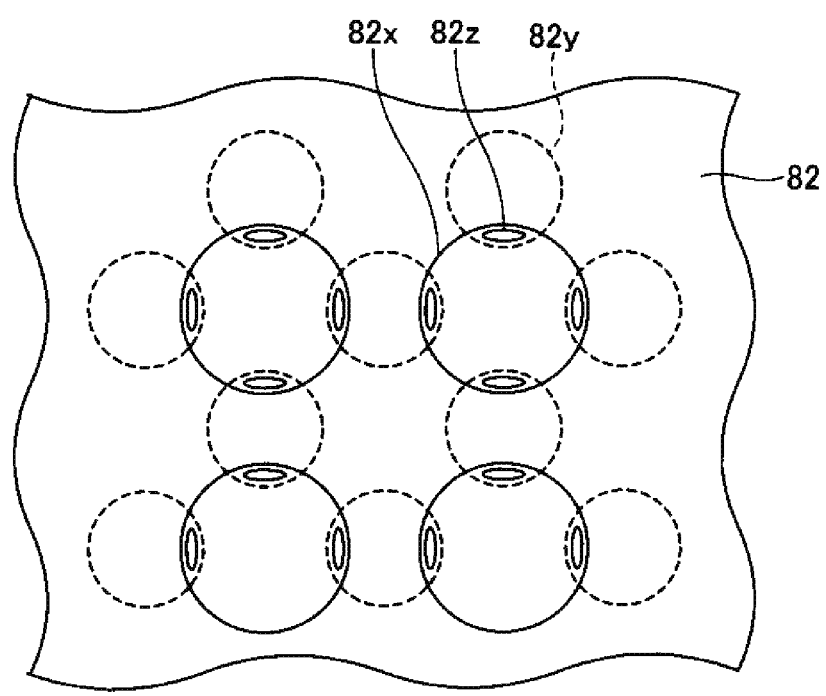
FIG. 14 is a view illustrating a modified example of a size of the bottomed hole.

FIG. 14 is a view illustrating a modified example of a size of the bottomed hole. In the exemplary embodiment and the first to third modified examples, the bottomed holes 82x and 82y and the bottomed holes 85x and 85y have substantially the same size. However, the present disclosure is not limited thereto.

As shown in FIG. 14, for example, the size of the bottomed hole 82x in the metal layer 82 may be made larger than the size of the bottomed hole 82y, and the plurality of bottomed holes 82y may be arranged around the bottomed hole 82x, as seen from above. In this way, since the sizes of some bottomed holes are increased to increase the space volume, it is possible to reduce the pressure loss of the operating fluid C flowing in the bottomed holes. The bottomed holes 85x and 85y are also the same.

Although the preferred embodiments have been described, the present disclosure is not limited to the above embodiments, and the embodiments can be diversely modified and replaced without departing from the claims.

For example, the inner surface-side (a side close to the flow path 50) of the metal layer 81, which is an outermost metal layer, may be formed with bottomed holes opening toward the metal layer 82 by the half etching, and the bottomed holes may be formed to communicate with the bottomed holes 82x formed in the metal layer 82. Likewise, the inner surface-side (a side close to the flow path 50) of the metal layer 86, which is an outermost metal layer, may be formed with bottomed holes opening toward the metal layer 85 by the half etching, and the bottomed holes may be formed to communicate with the bottomed holes 85y formed in the metal layer 85. In this case, since the formation region of the porous body increases, it is possible to improve the ability to guide the operating fluid C.

Also, the number of the metal layers to be stacked may be increased, and the porous body may be provided in the plurality of metal layers continuously stacked. Also in this case, since the formation region of the porous body increases, it is possible to improve the ability to guide the operating fluid C.

What is claimed is:

1. A loop-type heat pipe comprising:
    an evaporator configured to vaporize an operating fluid,
    a condenser configured to condense the operating fluid;
    a liquid pipe configured to interconnect the evaporator and the condenser;
    a porous body provided in the liquid pipe; and
    a vapor pipe configured to interconnect the evaporator and the condenser and to form a loop together with the liquid pipe,
    wherein the liquid pipe has a flow path provided in a stacked body of a plurality of metal layers,
    wherein when a stacking direction of the metal layers is referred to as an upper and lower direction, the plurality of metal layers comprises:
    a first metal layer configuring an upper wall surface of the flow path,
    a second metal layer configuring a lower wall surface of the flow path, and
    an intermediate metal layer stacked between the first metal layer and the second metal layer and configuring right and left wall surfaces of the flow path,
    wherein the porous body comprises:
    a first porous body having first bottomed holes recessed from one surface of the first metal layer facing the flow path, second bottomed holes recessed from the other surface of the first metal layer, and fine pores formed as the first bottomed holes and the second bottomed holes partially communicate with each other, and
    a second porous body having first bottomed holes recessed from one surface of the second metal layer facing the flow path, second bottomed holes recessed from the other surface of the second metal layer, and fine pores formed as the first bottomed holes and the second bottomed holes partially communicate with each other, and wherein the porous body is not provided in the intermediate metal layer.

2. The loop-type heat pipe according to claim 1, wherein the first porous body is partially arranged in a region of the first metal layer that faces the flow path.

3. The loop-type heat pipe according to claim 1, wherein the second porous body is partially arranged in a region of the second metal layer that faces the flow path.

4. The loop-type heat pipe according to claim 1, wherein the intermediate metal layer has a through-hole penetrating the intermediate metal layer in a thickness direction and forming the flow path, and
the intermediate metal layer is formed with at least one groove communicating with the flow path and widening a width of the flow path in a right and left direction.

5. The loop-type heat pipe according to claim 4, wherein the groove is a bottomed groove recessed from an upper surface of the intermediate metal layer toward a lower surface.

6. The loop-type heat pipe according to claim 4, wherein the groove is formed as a bottomed groove recessed from an upper surface of the intermediate metal layer toward a lower surface and a bottomed groove recessed from the lower surface of the intermediate metal layer toward the upper surface communicate with each other.

7. The loop-type heat pipe according to claim 1, wherein the plurality of metal layers comprises a plurality of the intermediate metal layers,
each of the intermediate metal layer has a through-hole penetrating the intermediate metal layer in a thickness direction and forming a part of the flow path, and
wherein at least one of the intermediate metal layers includes a through-groove penetrating the intermediate metal layer from an upper surface toward a lower surface, and communicating with the flow path and widening a width of the flow path in a right and left direction.

8. The loop-type heat pipe according to claim 1, wherein the first porous body extends from a region of the first metal layer that faces the flow path to a region that does not face the flow path.

9. The loop-type heat pipe according to claim 1, wherein the second porous body extends from a region of the second metal layer that faces the flow path to a region that does not face the flow path.

10. The loop-type heat pipe according to claim 1, wherein the flow path is a single flow path provided in the liquid pipe.

* * * * *